(12) United States Patent
Jenne et al.

(10) Patent No.: US 10,634,716 B2
(45) Date of Patent: Apr. 28, 2020

(54) METHOD FOR DETECTING ELECTRICAL FAULTS IN A CURRENT SUPPLY OF A CONSUMER

(71) Applicant: Robert Bosch GmbH, Stuttgart (DE)

(72) Inventors: Achim Jenne, Oberaichen (DE); Ulrich Foerch, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 150 days.

(21) Appl. No.: 15/886,356

(22) Filed: Feb. 1, 2018

(65) Prior Publication Data
US 2018/0238959 A1    Aug. 23, 2018

(30) Foreign Application Priority Data
Feb. 17, 2017 (DE) .................. 10 2017 202 594

(51) Int. Cl.
| | | |
|---|---|---|
| G01R 31/28 | (2006.01) | |
| G06F 1/28 | (2006.01) | |
| G01R 31/40 | (2020.01) | |
| G01R 19/165 | (2006.01) | |
| G01R 31/327 | (2006.01) | |
| G06F 1/30 | (2006.01) | |

(52) U.S. Cl.
CPC ... G01R 31/2879 (2013.01); G01R 19/16566 (2013.01); G01R 31/3275 (2013.01); G01R 31/40 (2013.01); G06F 1/28 (2013.01); G06F 1/30 (2013.01)

(58) Field of Classification Search
CPC ............ G01R 31/2891; G01R 31/2896; G01B 21/08; G01B 21/20; G01B 11/24; H01L 22/14
USPC ........................ 324/762.02, 762.01, 538, 537
See application file for complete search history.

(56) References Cited

U.S. PATENT DOCUMENTS

| | | | | |
|---|---|---|---|---|
| 6,617,972 B2* | 9/2003 | Takarada | ........... | G08B 21/0484 324/538 |
| 8,779,729 B2* | 7/2014 | Shiraishi | ............... | G06F 1/3212 320/155 |
| 2012/0098518 A1* | 4/2012 | Unagami | ............. | G01R 22/066 324/74 |

FOREIGN PATENT DOCUMENTS

| | | |
|---|---|---|
| DE | 102004023084 B3 | 6/2005 |
| DE | 102014018643 B3 | 3/2016 |

* cited by examiner

*Primary Examiner* — Giovanni Astacio-Oquendo
(74) *Attorney, Agent, or Firm* — Norton Rose Fulbright US LLP

(57) ABSTRACT

A method for detecting an electrical fault in a current supply of a consumer, where a transition resistance of the current supply allocated to the consumer is determined from a local voltage value allocated to the consumer, a local current value allocated to the consumer, and a global voltage value, and compared to a resistance threshold value allocated to the consumer, and an electrical fault in the current supply of the consumer is detected as a function of the comparison result.

9 Claims, 1 Drawing Sheet

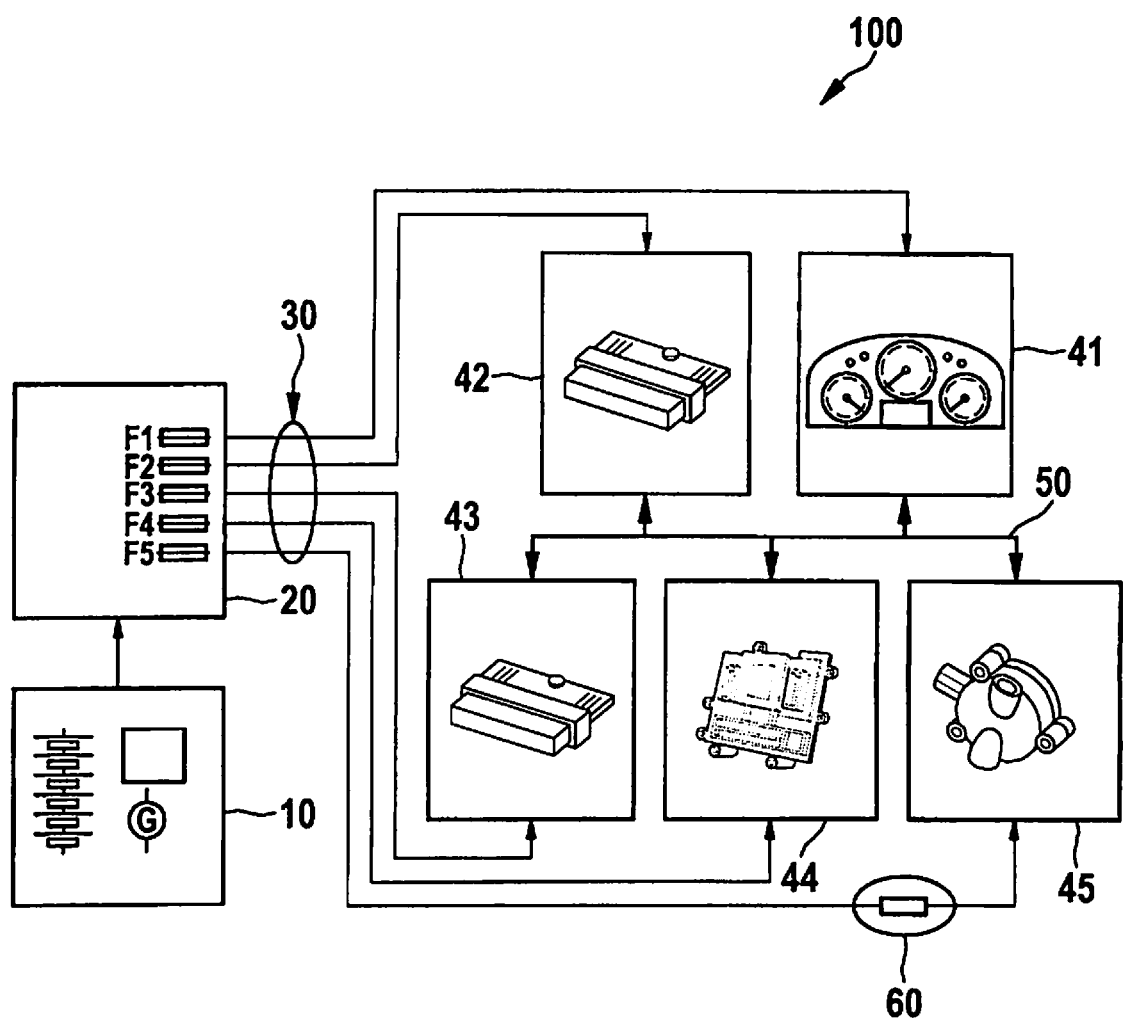

METHOD FOR DETECTING ELECTRICAL FAULTS IN A CURRENT SUPPLY OF A CONSUMER

CROSS REFERENCE

The present application claims the benefit under 35 U.S.C. § 119 of German Patent Application No. DE 102017202594.8 filed on Feb. 17, 2017, which is expressly incorporated herein by reference in its entirety.

FIELD

The present invention relates to a method for detecting an electrical fault in a current supply of a consumer; it also relates to a computer unit and a computer program for its execution.

BACKGROUND INFORMATION

German Patent No. DE 10 2014 018 643 B3 describes the generation of a voltage-reference value from a plurality of measured values of control units in a central master device. The control units are equipped with voltage-measuring devices and make the measured voltage values available to the central master device; the central master device then supplies the reference value to each control unit, so that they are able to ascertain a correction value for calibrating the voltage-measuring device.

German Patent No. DE 10 2004 023 084 B3 describes a method for monitoring the voltage in a vehicle-device system; in this instance, a control unit monitors for the presence of an undervoltage by comparing the applied actual voltage to a predefined lower voltage threshold.

SUMMARY

According to the present invention, a method for detecting an electrical fault in a current supply of a consumer as well as a computer unit and a computer program for its execution are provided, which have the features of the independent patent claims. Advantageous further developments are described herein.

To detect an electrical fault in a current supply of a consumer, the present invention utilizes the measure according to which a transition resistance of the current supply allocated to the consumer is determined and compared to a resistance threshold value allocated to said consumer. One preferred option for determining the transition resistance consists of forming the quotient from the difference between a global voltage value and a local voltage value allocated to the consumer on the one hand, and a local current value allocated to the consumer on the other hand. If the transition resistance significantly differs from an expected value, then this points to an electrical fault in the current supply.

A large number of different control units is used in modern vehicles. Virtually all modern control units have in common that they measure the electrical supply voltage in order to be able to calculate corrections for the own actuator signals. In one way or another, the different control units also communicate with one another. In the automotive sector, in particular the LIN and the CAN bus should be mentioned in this context, but FlexRay and different Ethernet buses are also available. The use of such a control-unit interconnection then provides the option of monitoring the quality of the electrical current supply. Here, the fact is selectively utilized that the supply voltage is measured at different locations in the electrical supply network. Another exploitable advantage is the clear separation between the electrical supply network and the communications network. Currently, each individual control unit in a vehicle performs its voltage measurement independently of the other control units. However, this method of approach places the focus only on the individual control unit with its actuators. What is missing is the system-wide method of approach including the cable harnesses, plug connectors and their aging effects. Within the scope of the present invention, the known (repeatedly executed) voltage measurement and an ascertained (in particular measured or calculated) current requirement are now used for evaluating the quality of the vehicle electrical system or the electrical current supply of a particular consumer.

Damage in the vehicle wiring that is not always manifesting fully is extremely difficult to detect through simple monitoring of the supply voltage. Generally, conventional voltage measurements are merely able to detect overvoltage and undervoltage faults, which, however, do not allow a conclusion as to the precise fault source. In contrast, the present invention now makes it possible to detect developing faults at an early stage as well. For example, damage to plug connectors with an increased transition resistance in the supply branch is able to be detected, as are fuses having an increased transition resistance, or faulty or partially damaged fuses. Even an only partially acting cable fracture, where individual conductors of multi-conductors are damaged, is able to be detected. The present invention also allows for the detection of manufacturing faults in solder connections or welded connections that feature a reduced transition surface, for example, or the detection of faults on circuit board or of weakened solder connections. Conventionally, such faults may lead to wide-ranging service-facility stays because they can be detected and allocated only with the greatest of difficulties.

Through the comparison of multiple consumers (especially control units), an individual electrical fault in the current supply is able to be distinguished from a system-wide undervoltage (empty battery).

The present invention may preferably be used as a pure software function on a wide variety of control units. There is no need to also carry out the calculation in the control units that directly perform the measurements of the voltage and current consumption. The measured values are preferably transmitted to a central instance (in particular a control unit), where the evaluation and the comparison with already known or applied threshold values are carried out. Such a function represents an advantageous example of a distributed application software in a computer network. In this way the present invention utilizes already existing resources for the voltage measurement and measures or calculates the current requirement of each individual control unit.

A computer unit according to the present invention such as a control unit of a motor vehicle is developed, in particular in terms of program technology, to execute a method according to the present invention.

The implementation of the present method in the form of a computer program is also advantageous because it is able to be realized at particularly low cost, especially when an executing control unit is also used for other tasks and is therefore already installed. Suitable data carriers, in particular for providing the computer program, are magnetic, optical and electrical memories, e.g., hard disks, flash memories, EEPROMs, DVDs and others. A download of a program via computer networks (internet, intranet, etc.) is possible as well.

Additional advantages and further refinements of the present invention result from the description below and the FIGURE.

The present invention is schematically shown in the FIGURE on the basis of an exemplary embodiment and is described below with reference to the FIGURE.

BRIEF DESCRIPTION OF THE DRAWING

FIG. 1 schematically shows a vehicle electrical system that has a multitude of control units.

DETAILED DESCRIPTION OF EXAMPLE EMBODIMENTS

FIG. 1 shows a vehicle electrical system 100 as it may form the basis of the present invention, in the form of a wiring diagram. Vehicle electrical system 100 has an electrical current supply 10, which includes a generator and a battery, in particular. Current supply 10 is connected to a fuse box 20 having individual fuses F1, F2, ..., which are meant to protect connected consumers from an overcurrent.

Different consumers such as control units 41-45 are connected via a cable harness 30. The control units may in particular involve what is known as an instrument cluster 41 for driver information, a vehicle control unit 42 (VCU) for specifying the driving and operating strategies, a gearbox control unit 43 (GCU) for the gear selection, an engine control unit 44 (ECU) for controlling the internal combustion engine, and a pump control unit 45 (PCU) for controlling a fuel pump. The control units are connected in a data-transmitting manner by way of a data bus 50, such as a CAN bus.

Preferably, at least one of the control units, e.g., vehicle control unit 42, is set up to execute a preferred specific embodiment of the present invention. At the same time, at least two, and preferably all, control units are developed to repeatedly, e.g., regularly, determine a local voltage value, especially through a measurement, as well as a local current value, especially through measurements, calculations or estimates, and to transmit the determined local voltage values and the local current values to vehicle control unit 42. As an alternative, it may also be the case that vehicle control unit 42 determines the local current values for one or more control unit(s) that are not designed to determine them on their own, for example, in particular via a calculation or estimate with the aid of characteristics maps, for example.

Vehicle control unit 42 then determines the transition resistance allocated to the consumer for each local voltage value/local current value pair and compares it to at least one resistance threshold value allocated to the consumer.

An advantageous component of the present invention is a software function, which compiles the available voltage values of the different control units and their current requirement (measured or calculated current requirement) via a network (CAN bus 50 in FIG. 1) (in FIG. 1, via five control units, for example). Systematic corrections, e.g., of offset voltages or ADC measuring errors, are advantageous in this context in order to improve the further calculations.

These values may be used for determining a global voltage value for a "probable supply voltage", which is used as a reference for the vehicle, e.g., as a maximum value, a mean value, a median, a combination thereof, etc. A current-free voltage measurement would be advantageous but is not mandatory. The highest possible reliability of the value of the calculated reference voltage, in particular through the mentioned systematic corrections, is of importance.

The transition resistance for each supply line to the control units is able to be calculated via the deviation of the individual local voltage values from the global voltage value and the associated current consumption. If the transition resistance deviates considerably in the direction of a higher value, then a developing fault is able to be detected and allocated in a predictive manner, especially before the affected control unit executes a faulty function due to a voltage that is too low.

For example, the current connection of pump control unit 45 has a weak point 60 that is to be detected as an electrical fault within the framework of the present invention. Weak point 60, for example, is defined in that one core of a four-core current feed line is defective.

Each connection between the line and the control-unit connection has a transition resistance, which is defined by the plug connection and the copper resistance of the cable. The specific resistance of copper at 25° C. amounts to $\rho=0.0173\ \Omega mm^2/m$.

The following applies to the electrical resistance of a circular line:

$$R_W = \frac{l \cdot \rho \cdot 4}{D^2 \cdot \pi}$$

at D=1 mm diameter, and l=2*5 m=10 m length, the result is $R_W=0.22\Omega$.

Together with the plug connection (depending on the manufacturer specifications, e.g. approx. $R_S=0.05\Omega$), the following results as transition resistance $R_{Ci}=R_W+R_S$ for each core i and, accordingly, as total transition resistance $R_{ges}$:

$$R_{ges} = \frac{1}{\frac{1}{R_{C1}} + \frac{1}{R_{C2}} + \frac{1}{R_{C3}} + \frac{1}{R_{C4}}}$$

This total transition resistance would be 33% higher in case of a defect of a core. In this way an electrical fault is detectable by comparing a currently ascertained total transition resistance to a comparison value or a threshold value.

Particularly easy to measure is an increased total transition resistance at a high power consumption because a clearly measurable voltage drop then results in local voltage value $U_L$ in comparison with supply voltage $U_G$ as the global voltage value. The instantaneous global voltage value may be determined especially from the voltage values of the particular measuring devices 41-45 that have the lowest possible current consumption just then or, ideally, that have no current consumption at all.

Instantaneous local voltage value $U_L$ is determined, in particular measured, in pump control device 45, as is local current value $I_L$. Together with global voltage value $U_L$, the following results as instantaneous transition resistance $R_L$:

$$R_L = \frac{U_G - U_L}{I_L},$$

Assuming a regular transition resistance of $R_{Ci}=0.27\Omega$ per line (1 mm diameter, 2*5 m long, plug), for example, then a total transition resistance $R_{ges}=0.0675\Omega$ results for four parallel lines. At $I_L=20$ A current consumption, a regular voltage drop of 1.35V comes about.

In case of damage, with only three parallel lines, a total transition resistance $R_{ges}=0.09\Omega$ results, and at a current consumption of 20 A, a voltage drop of now 1.8V. If there is even only one line left for active use, then the voltage drop already amounts to at least 5.4 V. Such voltage differences are easily measurable; conversely, the existing transition resistances are therefore able to be determined quite well and compared to reference values or threshold values.

For example, one or more resistance threshold value(s) may be stored in a characteristics map for each control unit. In the illustrated case, for instance, at a determined transition resistance of $R_L=0.0675$, the absence of faults may be assumed; at a determined transition resistance of $0.0675\Omega<R_L<0.09$, a developing fault of a core could be assumed, and at a determined transition resistance of $R_L>0.09\Omega$, an electrical fault, in particular in the form of a core defect seems likely, etc. It may also be useful to additionally provide even higher threshold values for characterizing additional electrical faults, such as a defect of two or three cores. For instance, the threshold values may be determined, such as measured, in a fault-free state, e.g., at the end of the line, for instance also across the whole category for a vehicle type.

When an electrical defect is detected, at least one measure will preferably be initiated from the group that includes the activation of a warning light, the setting of an error memory entry, a reduction in a permitted maximum current level, a change of the operating mode of the consumer. For instance, a pump power may be reduced.

The measure makes it possible to reach a vehicle-specific operating state that avoids damage and/or a risk. Such measures depend on the vehicle and are to be stored in a decision logic, for instance.

In case of faults in the vehicle, each segment of the current supply is able to be evaluated. Through a graphically processed representation on a diagnostic system, for example, the service technician is able to be assisted in searching for the search or in eliminating a fault through this function, or the effect may be viewed online (for instance in case of erratic contacts that lead to changes in the resistance).

What is claimed is:

1. A method for detecting an electrical fault in a current supply of a consumer, the method comprising:
   determining a transition resistance of the current supply allocated to the consumer from a local voltage value allocated to the consumer, a local current value allocated to the consumer, and a global voltage value;
   comparing the determined transition resistance to a resistance threshold value allocated to the consumer; and
   detecting an electrical fault in the current supply of the consumer as a function of the comparison result;
   wherein when an electrical defect is detected, at least one measure is initiated, from the group that includes: (i) an activation of a warning light, (ii) a setting of a fault-memory entry, (iii) a reduction of a permitted maximum current level, and (iv) a change in the operating mode of the consumer.

2. The method as recited in claim 1, wherein the local voltage value allocated to the consumer is ascertained in the consumer.

3. The method as recited in claim 1, wherein the local current value allocated to the consumer is ascertained in the consumer.

4. The method as recited in claim 1, wherein the global voltage value is ascertained from a plurality of local voltage values allocated to respective different consumers.

5. The method as recited in claim 4, wherein the global voltage value is ascertained from the plurality of local voltage values allocated to the respective different consumers through a calculation rule that includes at least one of a maximum-value formation, a mean-value formation, and a median-value formation.

6. The method as recited in claim 1, wherein the transition resistance allocated to the consumer is compared to the resistance threshold value allocated to the consumer in a computer unit that is separate from the consumer.

7. The method as recited in claim 6, wherein the transition resistance allocated to the consumer is determined in the computer unit that is separate from the consumer.

8. A computer unit for detecting an electrical fault in a current supply of a consumer, the computer unit designed to:
   determine a transition resistance of the current supply allocated to the consumer from a local voltage value allocated to the consumer, a local current value allocated to the consumer, and a global voltage value;
   compare the determined transition resistance to a resistance threshold value allocated to the consumer; and
   detect an electrical fault in the current supply of the consumer as a function of the comparison result;
   wherein when an electrical defect is detected, at least one measure is initiated, from the group that includes: (i) an activation of a warning light, (ii) a setting of a fault-memory entry, (iii) a reduction of a permitted maximum current level, and (iv) a change in the operating mode of the consumer.

9. A non-transitory machine-readable memory medium on which is stored a computer program for detecting an electrical fault in a current supply of a consumer, the computer program, when executed on a computing unit, causing the computing unit to perform:
   determining a transition resistance of the current supply allocated to the consumer from a local voltage value allocated to the consumer, a local current value allocated to the consumer, and a global voltage value;
   comparing the determined transition resistance to a resistance threshold value allocated to the consumer; and
   detecting an electrical fault in the current supply of the consumer as a function of the comparison result;
   wherein when an electrical defect is detected, at least one measure is initiated, from the group that includes: (i) an activation of a warning light, (ii) a setting of a fault-memory entry, (iii) a reduction of a permitted maximum current level, and (iv) a change in the operating mode of the consumer.

* * * * *